United States Patent
Tanaka

(10) Patent No.: US 10,535,562 B2
(45) Date of Patent: Jan. 14, 2020

(54) PROCESSING METHOD FOR WORKPIECE

(71) Applicant: DISCO CORPORATION, Tokyo (JP)

(72) Inventor: Hideaki Tanaka, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 130 days.

(21) Appl. No.: 15/919,890

(22) Filed: Mar. 13, 2018

(65) Prior Publication Data

US 2018/0261505 A1    Sep. 13, 2018

(30) Foreign Application Priority Data

Mar. 13, 2017 (JP) ................. 2017-047317

(51) Int. Cl.
  *H01L 21/78* (2006.01)
  *H01L 21/687* (2006.01)

(52) U.S. Cl.
  CPC ........ *H01L 21/78* (2013.01); *H01L 21/68714* (2013.01)

(58) Field of Classification Search
  CPC ............... H01L 21/78; H01L 21/68714; H01L 21/67092
  See application file for complete search history.

(56) References Cited

U.S. PATENT DOCUMENTS

| | | | | |
|---|---|---|---|---|
| 2014/0073067 A1* | 3/2014 | Uchida | ................... | H01L 21/78 438/5 |
| 2016/0035635 A1* | 2/2016 | Tanaka | ................... | H01L 22/20 438/7 |
| 2016/0279753 A1* | 9/2016 | Sekiya | ................... | B24B 19/02 |
| 2016/0284611 A1* | 9/2016 | Sekiya | ................... | H01L 22/20 |
| 2016/0297091 A1* | 10/2016 | Komatsu | ................ | B26D 3/065 |
| 2017/0186646 A1* | 6/2017 | Ohkubo | .............. | H01L 21/3043 |
| 2018/0215010 A1* | 8/2018 | Sekiya | ................... | B24B 53/12 |
| 2018/0286758 A1* | 10/2018 | Takenouchi | ............ | H01L 21/78 |
| 2018/0366371 A1* | 12/2018 | Tanaka | ................... | H01L 21/78 |
| 2019/0035689 A1* | 1/2019 | Yamamoto | ............ | H01L 21/822 |
| 2019/0157151 A1* | 5/2019 | Sekiya | ................... | H01L 21/78 |
| 2019/0198379 A1* | 6/2019 | Sekiya | .............. | H01L 21/68728 |

FOREIGN PATENT DOCUMENTS

JP    11074228 A    3/1999

* cited by examiner

*Primary Examiner* — William F Kraig
*Assistant Examiner* — Khatib A Rahman
(74) *Attorney, Agent, or Firm* — Greer Burns & Crain Ltd.

(57) ABSTRACT

A processing method for a workpiece includes: a holding step of holding the workpiece by a chuck table; a groove forming step of moving the chuck table in a processing feeding direction at a first speed, and sequentially cutting a plurality of division lines extending in a first direction by a first cutting blade to form the workpiece with grooves along the division lines; a first deep-cutting step of further cutting the grooves, by a second cutting blade, to thereby deep-cut the grooves, during when the groove forming step is performed; and a second deep-cutting step of moving the chuck table in the processing feeding direction at a second speed higher than the first speed, and further cutting by the second cutting blade those of the grooves which have not been deep-cut in the first deep-cutting step, to thereby deep-cut those grooves, after the groove forming step.

1 Claim, 3 Drawing Sheets

PROCESSING METHOD FOR WORKPIECE

BACKGROUND OF THE INVENTION

Field of the Invention

The present invention relates to a processing method for processing a plate-shaped workpiece.

Description of the Related Art

When a semiconductor wafer or a packaged substrate or the like is divided into a plurality of chips, for example, a cutting apparatus in which an annular cutting blade is mounted to a spindle serving as a rotary shaft is used (see, for example, Japanese Patent Laid-open No. Hei 11-74228). The cutting blade, being rotated at a high speed, is made to deeply cut into the workpiece such as the semiconductor wafer or the packaged substrate, whereby the workpiece can be cut and divided.

Meanwhile, a functional layer such as a metallic film functioning as wirings and an insulating film (typically, a low-k film) for insulation between the wirings is often provided on the whole area on the front surface side of the above-mentioned workpiece. However, when it is intended to cut such a workpiece by a cutting blade, the functional layer may be easily chipped due to a load at the time of processing, or chipping may be easily generated in the back surface under influence of the functional layer. In view of this, a processing method called step cutting is sometimes adopted in which the functional layer of the workpiece is removed by a first cutting blade wider in width (larger in thickness), and thereafter the base material of the workpiece is cut by a second cutting blade narrower in width (smaller in thickness) than the first cutting blade. By thus cutting the workpiece using different cutting blades each suitable for cutting of the functional layer and for cutting of the base material, chipping of the functional layer or the base material can be restrained. In this case, by use of a cutting apparatus having two sets of spindles to which different cutting blades can be mounted, the time required for processing can be shortened.

SUMMARY OF THE INVENTION

However, there is a need, in using the aforementioned cutting apparatus, for further shortening the time required for processing.

It is therefore an object of the present invention to provide a processing method for a workpiece by which the time required for processing can be further shortened.

In accordance with an aspect of the present invention, there is provided a processing method for a workpiece, the workpiece having a flat plate-shaped base material and a functional layer formed on the base material, the workpiece being partitioned into a plurality of regions by a plurality of division lines extending in a first direction and a plurality of division lines extending in a second direction intersecting the first direction, the processing method being for cutting the workpiece along the division lines by use of a cutting apparatus. The cutting apparatus includes a chuck table having a holding surface on which to hold the workpiece, a cutting unit that includes a first spindle on which to mount a first cutting blade and a second spindle on which to mount a second cutting blade and that cuts the workpiece held on the chuck table by the first cutting blade and the second cutting blade, a processing feeding unit that moves the chuck table in a processing feeding direction parallel to the holding surface, and an indexing feeding unit that moves the cutting unit in an indexing feeding direction parallel to the holding surface and intersecting the processing feeding direction, the first spindle and the second spindle each having an axis parallel to the indexing feeding direction, and the first cutting blade and the second cutting blade being disposed in such a manner as to face each other. The processing method for the workpiece includes a holding step of holding the workpiece by the chuck table in such a manner that the functional layer is exposed; a groove forming step of moving the chuck table in the processing feeding direction at a first speed, and sequentially cutting the plurality of division lines extending in the first direction by the first cutting blade to form the workpiece with grooves along the division lines, thereby removing the functional layer overlapping with the division lines; a first deep-cutting step of further cutting the grooves formed along the division lines extending in the first direction, by the second cutting blade, to thereby deep-cut the grooves, during when the groove forming step is performed; and a second deep-cutting step of moving the chuck table in the processing feeding direction at a second speed higher than the first speed, and further cutting by the second cutting blade those of the grooves along the division lines extending in the first direction which have not been deep-cut in the first deep-cutting step, to thereby deep-cut those grooves, after the groove forming step.

In the processing method for a workpiece according to a mode of the present invention, during when the groove forming step of moving the chuck table in the processing feeding direction at the first speed and sequentially cutting the division lines by the first cutting blade to form the workpiece with the grooves along the division lines is performed, the first deep-cutting step is carried out in which the groove formed along the division lines are further cut, thereby deep-cut, by the second cutting blade. In addition, after the groove forming step and the first deep-cutting step, the second deep-cutting step is carried out in which the chuck table is moved in the processing feeding direction at the second speed higher than the first speed, and those of the grooves formed along the division lines which have not been deep-cut in the first deep-cutting step are further cut, thereby deep-cut, by the second cutting blade. In general, the base material is easier to cut than the functional layer; therefore, if only cutting of the base material is to be conducted, it is highly possible that the moving speed of the chuck table in the processing feeding direction can be enhanced, as compared to the case where the base material and the functional layer are simultaneously cut. Accordingly, the time required for processing can be shortened, as compared to the case where all the grooves are deep-cut by moving the chuck table in the processing feeding direction at the first speed.

The above and other objects, features and advantages of the present invention and the manner of realizing them will become more apparent, and the invention itself will best be understood from a study of the following description and appended claim with reference to the attached drawings showing a preferred embodiment of the invention.

DETAILED DESCRIPTION OF THE PREFERRED EMBODIMENT

Figure 1:
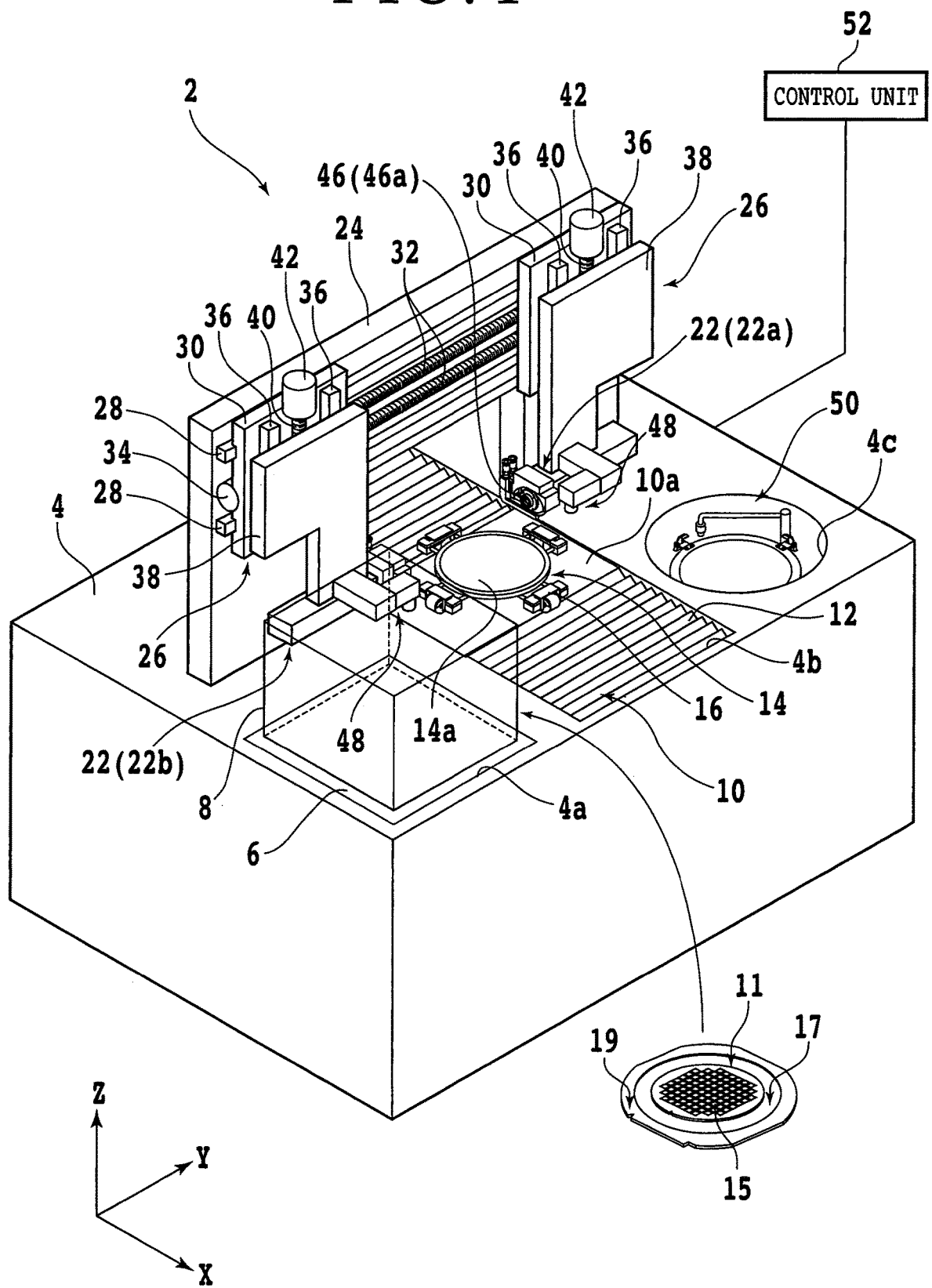
FIG. 1 is a perspective view showing schematically a configuration example of a cutting apparatus.

An embodiment according to a mode of the present invention will be described, referring to the attached drawings. In the first place, a configuration example of a cutting apparatus to be used for a processing method for a workpiece according to the present embodiment will be described. FIG. 1 is a perspective view showing schematically a configuration example of a cutting apparatus 2. As illustrated in FIG. 1, the cutting apparatus 2 has a base 4 which supports constituent elements. The base 4 is formed with an opening 4a at a corner portion on a front side, and a cassette support base 6 lifted up and down by a lifting mechanism (not shown) is provided in the opening 4a. A cassette 8 in which to accommodate a plurality of workpieces 11 is placed on an upper surface of the cassette support base 6. Note that in FIG. 1, only a contour of the cassette 8 is shown, for convenience of explanation.

Figure 2A:
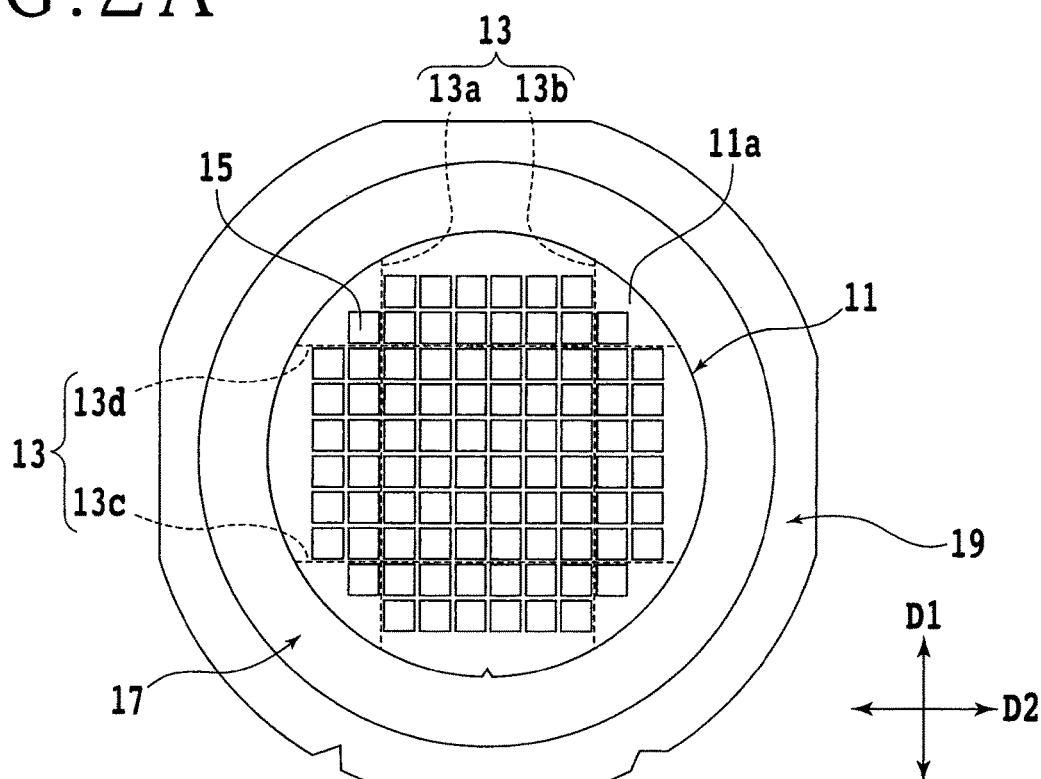
FIG. 2A is a plan view showing schematically a configuration example of a workpiece.

FIG. 2A is a plan view showing schematically a configuration example of the workpiece 11. The workpiece 11 includes as a base material a disk-shaped wafer formed of a semiconductor material such as silicon, for example. A front surface 11a side of the workpiece 11 is partitioned into a plurality of regions by division lines (streets) 13 extending in a first direction D1 and a second direction D2 intersecting the first direction D1, and a device 15 such as an IC (Integrated Circuit) is formed in each of the regions. The base material constituting the workpiece 11 is provided with a functional layer (not shown) in which a metallic film functioning as wirings for the above-mentioned devices 15, a metallic film constituting a TEG (Test Elements Group), an insulating film (typically, a low-k film) for insulation between wirings, and the like are stacked. In other words, a part of the functional layer constitutes a part of the above-mentioned device 15 or the like. In addition, a surface of the functional layer is exposed to the front surface 11a side of the workpiece 11. An adhesive tape (dicing tape) 17 larger than the workpiece 11 in diameter is attached to a back surface 11b (see FIG. 2B and the like) side of the workpiece 11. An outer peripheral portion of the adhesive tape 17 is fixed to an annular frame 19. The workpiece 11 is accommodated in the cassette 8 in the state of being supported on the frame 19 through the adhesive tape 17.

Note that while the disk-shaped wafer formed of a semiconductor material such as silicon constitutes the base material of the workpiece 11 in the present embodiment, there is no limitation as to the material, shape, structure, size or the like of the base material. For example, base materials formed of such materials as other semiconductors, ceramics, resins and metals may also be used. In addition, there is no limitation as to the kind, number, shape, structure, size, layout or the like of the devices 15.

As depicted in FIG. 1, an opening 4b elongated in an X-axis direction (front-rear direction, or processing feeding direction) is formed at a lateral side of the cassette support base 6. An X-axis moving mechanism (processing feeding unit) 10 of a ball screw type and a dust-proof and droplet-proof cover 12 covering an upper portion of the X-axis moving mechanism 10 are disposed in the opening 4b. The X-axis moving mechanism 10 has an X-axis moving table 10a, and moves the X-axis moving table 10a in the X-axis direction. A chuck table (holding table) 14 on which to hold the workpiece 11 by suction is disposed on the X-axis moving table 10a. The chuck table 14 is connected to a rotational drive source (not shown) such as a motor, and is rotated about a rotational axis which is substantially parallel to a Z-axis direction (vertical direction). In addition, the chuck table 14 is moved in the X-axis direction (processing feeding) by the above-mentioned X-axis moving mechanism 10. An upper surface of the chuck table 14 is a holding surface 14a on which to hold the workpiece 11 by suction. The holding surface 14a is formed to be substantially parallel to the X-axis direction and a Y-axis direction (left-right direction, or indexing feeding direction), and is connected to a suction source (not shown) through a suction passage 14b (see FIG. 2B and the like) formed inside the chuck table 14 and the like. Besides, in the periphery of the chuck table 14, there are provided four clamps 16 for fixing, from four sides, the annular frame 19 that supports the workpiece 11.

A carrying unit (not shown) for carrying the aforementioned workpiece 11 to the chuck table 14 and the like is disposed in a region adjacent to the opening 4b. The workpiece 11 carried by the carrying unit is placed on the holding surface 14a of the chuck table 14 in such a manner that the front surface 11a side thereof is exposed to the upper side, for example.

On an upper surface of the base 4, a gate-formed support structure 24 for supporting two sets of cutting units 22 (a first cutting unit 22a and a second cutting unit 22b) is disposed in the manner of straddling the opening 4b. At an upper portion of a front surface of the support structure 24, there are provided two sets of cutting unit moving mechanisms (indexing feeding units) 26 for moving each of the cutting units 22 in the Y-axis direction and the Z-axis direction. Each of the cutting unit moving mechanisms 26 has, in common, a pair of Y-axis guide rails 28 disposed on a front surface of the support structure 24 and parallel to the Y-axis direction. Y-axis moving plates 30 constituting the cutting unit moving mechanisms 26 are slidably mounted to the Y-axis guide rails 28. A nut portion (not shown) is provided on a back surface side (rear surface side) of each Y-axis moving plate 30, and a Y-axis ball screw 32 parallel to the Y-axis guide rail 28 is in screw engagement with the nut portion. A Y-axis pulse motor 34 is connected to one end portion of each Y-axis ball screw 32. With the Y-axis ball screws 32 rotated by the Y-axis pulse motor 34, the Y-axis moving plates 30 are moved in the Y-axis direction along the Y-axis guide rails 28.

A pair of Z-axis guide rails 36 parallel to the Z-axis direction are provided on a front surface of each Y-axis moving plate 30. A Z-axis moving plate 38 is slidably mounted to the Z-axis guide rails 36. A nut portion (not shown) is provided on a back surface side (rear surface side) of each Z-axis moving plate 38, and a Z-axis ball screw 40 parallel to the Z-axis guide rail 36 is in screw engagement with the nut portion. A Z-axis pulse motor 42 is connected to one end portion of each Z-axis ball screw 40. With the Z-axis ball screws 40 rotated by the Z-axis pulse motors 42, the Z-axis moving plates 38 are moved in the Z-axis direction along the Z-axis guide rails 36.

The cutting unit 22 is provided at a lower portion of each Z-axis moving plate 38. The cutting unit 22 includes a spindle 44 (a first spindle 44a and a second spindle 44b) (see FIG. 2B and the like) having an axis substantially parallel to the Y-axis direction. An annular cutting blade 46 (a first cutting blade 46a and a second cutting blade 46b) (see FIG. 2B and the like) is mounted to one end side of the spindle 44. In the present embodiment, a first cutting blade 46a formed of a material suitable for removal of the functional layer and having a first width (first thickness) and a second cutting blade 46b formed of a material suitable for removal of the base material and having a second width (second thickness) narrower (thinner) than the first width are used. While the first width and the second width are not particularly limited, it is recommendable that the first width is 40 to 60 μm, and the second width is 15 to 35 μm, for example. Note that the first cutting blade 46a and the second cutting blade 46b are disposed at such positions as to face each other, in the state of being mounted to the spindle 44. An imaging unit (camera) 48 for imaging the workpiece 11 and the like is provided at a position adjacent to each cutting unit 22. With the Y-axis moving plate 30 moved in the Y-axis direction by each cutting unit moving mechanism 26, the cutting unit 22 and the imaging unit 48 are moved in the Y-axis direction (indexing feeding). In addition, with the Z-axis moving plate 38 moved in the Z-axis direction by each cutting unit moving mechanism 26, the cutting unit 22 and the imaging unit 48 are moved in the Z-axis direction.

An opening 4c is formed at a position on the opposite side of the opening 4b from the opening 4a. A cleaning unit 50 for cleaning the workpiece 11 having been cut and the like is disposed in the opening 4c. A control unit 52 is connected to each of constituent elements such as the X-axis moving mechanism 10, the chuck table 14, the cutting units 22, the cutting unit moving mechanisms 26, the cameras 48, and the cleaning unit 50. Each of the constituent elements is controlled by the control unit 52.

In the processing method for a workpiece according to the present embodiment, first, a holding step of holding the workpiece 11 by the chuck table 14 is conducted. Specifically, the adhesive tape 17 attached to the back surface 11b side of the workpiece 11 is put in contact with the holding surface 14a of the chuck table 14, and a negative pressure of the suction source is made to act thereon. In addition, the frame 19 is fixed by the clamps 16. As a result of this, the workpiece 11 is held by the chuck table 14 in a state in which the functional layer on the front surface 11a side thereof is exposed to the upper side.

Figure 2B:
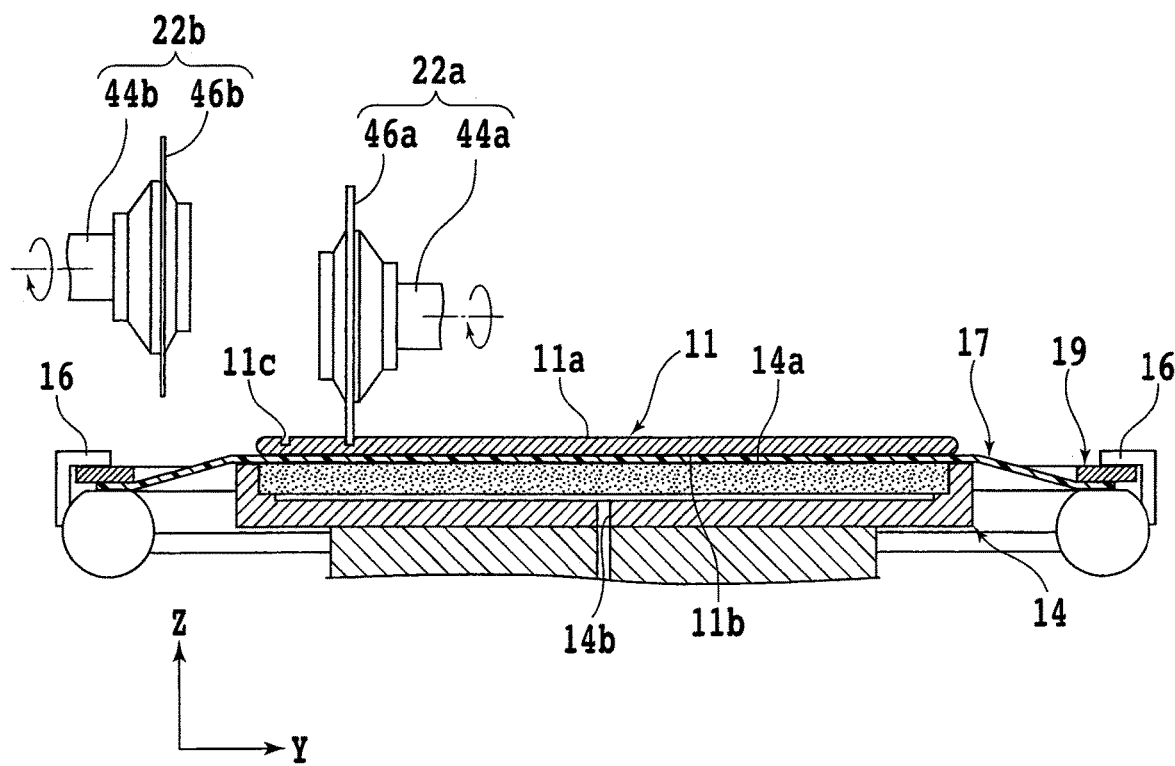
FIG. 2B is a partially sectional side view for explaining a groove forming step.

After the holding step, a groove forming step is performed in which a plurality of division lines 13 extending in the first direction D1, for example, are sequentially cut by the first cutting blade 46a to form a plurality of grooves. FIG. 2B is a partially sectional side view for explaining the groove forming step. In the groove forming step, first, the chuck table 14 is rotated, to align the first direction D1 of the workpiece 11 to the X-axis direction of the cutting apparatus 2. In addition, the chuck table 14 and the first cutting unit 22a are moved relative to each other, to adjust the position of the first cutting blade 46a onto an extension line of the target division line 13 extending in the first direction D1. Then, the lower end of the first cutting blade 46a is moved to a position which is lower than the front surface 11a of the workpiece 11 and is higher than the back surface 11b of the workpiece 11. To be more specific, the lower end of the first cutting blade 46 is moved to a position slightly below the boundary between the base material and the functional layer which constitute the workpiece 11. Normally, the thickness of the functional layer is not more than 10 μm, and, therefore, it is sufficient that the first cutting blade 46a is made to cut into the workpiece 11 by 20 to 50 μm, typically by approximately 40 μm.

Thereafter, with the first cutting blade 46a kept rotating, the chuck table 14 is moved in the X-axis direction. Here, the moving speed of the chuck table 14 is set to a first speed suitable for removal of the functional layer. It is preferable that the first speed is set to be, for example, not less than 40 mm/second and less than 80 mm/second, typically set to approximately 50 mm/second. By this, the first cutting blade 46a can be made to cut into the workpiece 11 along the target division line 13, thereby to form a groove 11c. As a result, the functional layer overlapping with the target division line 13 is removed. This operation is repeated, and, when the grooves 11c are formed along all the division lines 13 extending in the first direction D1, the groove forming step is finished.

Figure 3A:
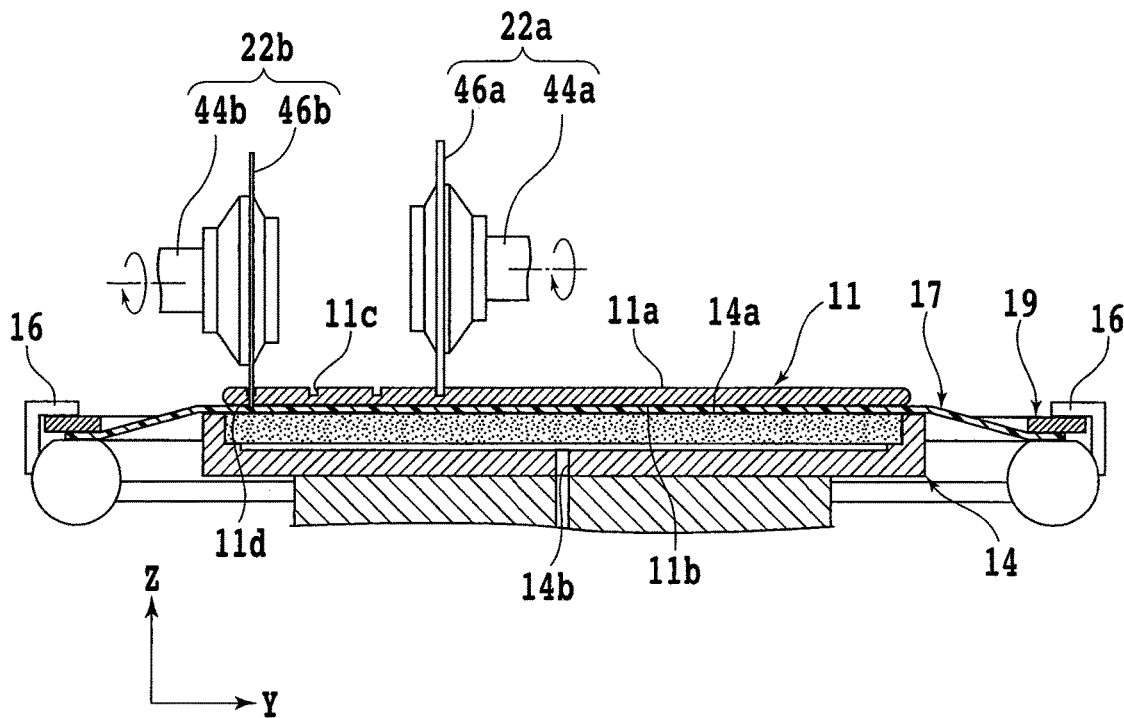
FIG. 3A is a partially sectional side view for explaining a first deep-cutting step.

During when the aforementioned groove forming step is performed, a first deep-cutting step is conducted in which the groove 11c formed in the groove forming step is further deep-cut by the second cutting blade 46b. FIG. 3A is a partially sectional side view for explaining the first deep-cutting step. In the present embodiment, the first deep-cutting step is started, after the formation of the groove 11c along a division line (street) 13a extending in the first direction D1 is finished, as shown in FIGS. 2A, 2B and 3A. Specifically, a sufficient spacing is secured between the division line 13 along which the groove 11c is formed in the groove forming step and the groove 11c which is deep-cut in the first deep-cutting step, such that the first cutting blade 46a used in the groove forming step and the second cutting blade 46b used in the first deep-cutting step are not too close to each other. With this configuration, the groove forming step and the first deep-cutting step can be advanced simultaneously (concurrently), while preventing the first cutting unit 22a and the second cutting unit 22b from contacting each other. The spacing between the division line 13 along which the groove 11c is formed in the groove forming step and the groove 11c which is deep-cut in the first deep-cutting step is not particularly limited; for example, it is preferable that the spacing is 15 to 30 mm, and is typically approximately 20 mm.

In the first deep-cutting step, first, the chuck table 14 and the second cutting unit 22b are moved relative to each other, to adjust the position of the second cutting blade 46b onto an extension line of the target groove 11c. Then, the lower end of the second cutting blade 46b is moved to a position lower than the back surface 11b of the workpiece 11. Thereafter, with the second cutting blade 46b kept rotating, the chuck table 14 is moved in the X-axis direction. By this, the target groove 11c can be further cut, thereby deep-cut, by the second cutting blade 46b, to form a kerf (cut or slit) 11d for dividing the workpiece 11. Note that the first deep-cutting step and the groove forming step are advanced simultaneously (concurrently). Specifically, the operation of the chuck table 14 in the first deep-cutting step is matched to the operation of the chuck table 14 in the groove forming step. In other words, the moving speed of the chuck table 14 at the time when the second cutting blade 46b cuts into the groove 11c is the same speed (first speed) as the moving speed of the chuck table 14 at the time when the first cutting blade 46a cuts into the division line 13 in the groove forming step. In addition, simultaneously when the groove forming step is finished, the first deep-cutting step is also finished.

Figure 3B:
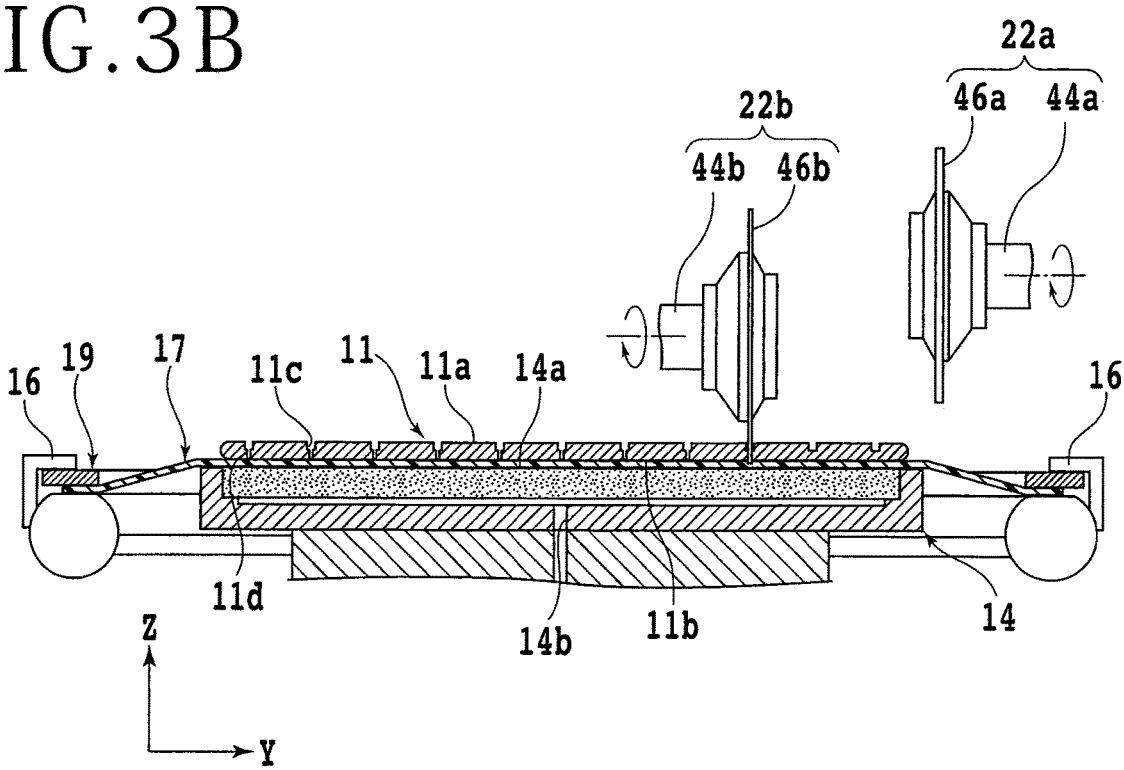
FIG. 3B is a partially sectional side view for explaining a second deep-cutting step.

After the groove forming step and the first deep-cutting step, a second deep-cutting step is conducted in which those of the grooves 11c formed in the groove forming step which have not been deep-cut in the first deep-cutting step are deep-cut by the second cutting blade 46b. FIG. 3B is a partially sectional side view for explaining the second deep-cutting step. As aforementioned, in the present embodiment, the spacing between the division line 13 along which the groove 11c is formed in the groove forming step and the groove 11c which is deep-cut in the first deep-cutting step (namely, the spacing between the division line 13 and the groove 11c which are simultaneously processed by the first cutting blade 46a and the second cutting blade 46b) is made to be a sufficient spacing. Therefore, after the groove forming step is finished, a plurality of grooves 11c which have not been deep-cut in the first deep-cutting step are left. In the present embodiment, the second deep-cutting step is started with the groove 11c which is formed along a division line (street) 13b extending in the first direction D1 and which has not been deep-cut in the first deep-cutting step, as shown in FIGS. 2A and 3B.

In the second deep-cutting step, first, the chuck table 14 and the second cutting unit 22b are moved relative to each other, to align the position of the second cutting blade 46b onto an extension line of the target groove 11c. Then, the lower end of the second cutting blade 46b is moved to a position lower than the back surface 11b of the workpiece 11. Thereafter, with the second cutting blade 46b kept rotating, the chuck table 14 is moved in the X-axis direction. Here, the moving speed of the chuck table 14 is set to a second speed higher than the first speed. The second speed is, for example, 80 to 150 mm/second, and is typically approximately 100 mm/second. By this, the target groove 11c can be further cut, thereby deep-cut, by the second cutting blade 46b, to form a kerf (cut or slit) 11d for dividing the workpiece 11. This operation is repeated, and, when the kerfs 11d are formed at all the grooves 11c which have not been deep-cut in the first deep-cutting step, the second deep-cutting step is finished.

After the workpiece 11 is divided along the plurality of division lines 13 extending in the first direction D1 by the aforementioned groove forming step, the first deep-cutting step and the second deep-cutting step, the workpiece 11 is divided along a plurality of division lines 13 extending in the second direction D2 in the same procedure as above. In other words, the groove forming step, the first deep-cutting step and the second deep-cutting step which are the same as above are applied to the plurality of division lines 13 extending in the second direction D2. By this, the workpiece 11 can be divided along all the division lines 13, to form a plurality of chips. Note that in the present embodiment, for example, the first deep-cutting step is started after the formation of the groove 11c along a division line (street) 13c extending in the second direction D2 in the groove forming step is finished, as shown in FIG. 2A. In addition, for example, the second deep-cutting step is started with the groove 11c which is formed along a division line (street) 13d extending in the second direction D2 as shown in FIG. 2A.

As has been described above, in the processing method for a workpiece according to the present embodiment, during when the groove forming step of moving the chuck table 14 in the X-axis direction (processing feeding direction) at the first speed so as to sequentially cut the division lines 13 by the first cutting blade 46a and to thereby form the workpiece 11 with the grooves 11c along the division lines 13 is conducted, the first deep-cutting step is carried out in which the grooves 11c formed along the division lines 13 are further cut, thereby deep-cut, by the second cutting blade 46b. In addition, after the groove forming step and the first deep-cutting step, the second deep-cutting step is carried out in which the chuck table 14 is moved in the X-axis direction at the second speed higher than the first speed and those of the grooves 11c formed in the division lines 13 which have not been deep-cut in the first deep-cutting step are further cut, thereby deep-cut, by the second cutting blade 46b. In general, the base material is easier to cut than the functional layer. When cutting of the base material is only conducted, therefore, it is highly possible that the moving speed of the chuck table 14 in the X-axis direction can be enhanced as compared to the case where the base material and the functional layer are simultaneously cut. Accordingly, the time required for processing can be shortened, as compared to the case where all the grooves 11c are deep-cut by moving the chuck table 14 in the X-axis direction at the first speed.

Note that the present invention is not limited to the description of the above embodiment and the like, and the invention can be carried out with various modifications. For example, while the kerfs 11d for dividing the workpiece 11 are formed in the first deep-cutting step and the second deep-cutting step in the above embodiment, the workpiece 11 may not necessarily be cut completely in the first deep-cutting step and the second deep-cutting step.

The present invention is not limited to the details of the above described preferred embodiment. The scope of the invention is defined by the appended claim and all changes and modifications as fall within the equivalence of the scope of the claim are therefore to be embraced by the invention.

What is claimed is:

1. A processing method for a workpiece, the workpiece having a flat plate-shaped base material and a functional layer formed on the base material, the workpiece being partitioned into a plurality of regions by a plurality of division lines extending in a first direction and a plurality of division lines extending in a second direction intersecting the first direction, the processing method being for cutting the workpiece along the division lines by use of a cutting apparatus, the cutting apparatus including a chuck table having a holding surface on which to hold the workpiece, a cutting unit that includes a first spindle on which to mount a first cutting blade and a second spindle on which to mount a second cutting blade and that cuts the workpiece held on the chuck table by the first cutting blade and the second cutting blade, a processing feeding unit that moves the chuck table in a processing feeding direction parallel to the holding surface, and an indexing feeding unit that moves the cutting unit in an indexing feeding direction parallel to the holding surface and intersecting the processing feeding direction, the first spindle and the second spindle each having an axis parallel to the indexing feeding direction, and the first cutting blade and the second cutting blade being disposed in such a manner as to face each other, the processing method comprising:

a holding step of holding the workpiece by the chuck table in such a manner that the functional layer is exposed;

a groove forming step of moving the chuck table in the processing feeding direction at a first speed, and sequentially cutting the plurality of division lines extending in the first direction by the first cutting blade to form the workpiece with grooves along the division lines, thereby removing the functional layer overlapping with the division lines;

a first deep-cutting step of further cutting the grooves formed along the division lines extending in the first direction, by the second cutting blade, to thereby deep-cut the grooves, during when the groove forming step is performed; and a second deep-cutting step of moving the chuck table in the processing feeding direction at a second speed higher than the first speed, and further cutting by the second cutting blade those of the grooves along the division lines extending in the first direction which have not been deep-cut in the first deep-cutting step, to thereby deep-cut those grooves, after the groove forming step.

* * * * *